(12) United States Patent
Fartash et al.

(10) Patent No.: US 6,552,275 B2
(45) Date of Patent: Apr. 22, 2003

(54) SURFACE MOUNT COMPONENT

(75) Inventors: Arjang Fartash, Aloha, OR (US); Raiyomand F. Aspandiar, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/835,758

(22) Filed: Apr. 16, 2001

(65) Prior Publication Data

US 2002/0148638 A1 Oct. 17, 2002

(51) Int. Cl.[7] .................................................. H05K 1/16
(52) U.S. Cl. ........................ 174/260; 174/255; 174/265; 361/756; 361/760; 361/772; 257/696; 257/730; 257/779
(58) Field of Search ................................. 174/255, 260, 174/265, 52.1, 261, 138 G, 266, 52.4; 361/760, 740, 773, 741, 743, 747, 756, 767, 772, 774, 802, 807, 809, 782, 783; 257/693, 694, 696, 735, 730, 779; 29/840; 228/180.21

(56) References Cited

U.S. PATENT DOCUMENTS

| | | | | |
|---|---|---|---|---|
| 3,772,632 A | * | 11/1973 | Rattcliff et al. ............... 339/73 |
| 4,028,738 A | * | 6/1977 | Rouvre et al. .............. 361/767 |
| 4,951,176 A | * | 8/1990 | Bergfried et al. ........... 361/760 |
| 4,967,262 A | * | 10/1990 | Farnsworth .................. 257/678 |
| RE33,541 E | * | 2/1991 | Pryst et al. .................. 338/226 |
| 5,014,113 A | * | 5/1991 | Casto ........................ 174/52.4 |
| 5,041,901 A | * | 8/1991 | Kitano et al. ............... 257/669 |
| 5,117,330 A | * | 5/1992 | Miazga ........................ 361/760 |
| 5,299,091 A | * | 3/1994 | Hoshi et al. ............... 174/16.3 |
| 5,347,429 A | * | 9/1994 | Kohno et al. .............. 174/52.4 |
| 5,352,851 A | * | 10/1994 | Wallace et al. ............ 174/52.4 |
| 5,399,804 A | * | 3/1995 | Yoneda et al. ............. 174/52.4 |
| 5,540,378 A | * | 7/1996 | Mahulikar et al. ..... 228/180.21 |
| 5,671,125 A | * | 9/1997 | Russell et al. ............. 361/760 |
| 5,731,958 A | * | 3/1998 | Kozel ......................... 361/743 |
| 6,010,920 A | * | 1/2000 | Hellgren et al. ........... 438/106 |
| 6,177,632 B1 | * | 1/2001 | Ashdown ................... 174/52.1 |
| 6,207,298 B1 | * | 3/2001 | Fukui ......................... 428/646 |

* cited by examiner

Primary Examiner—David L. Talbott
Assistant Examiner—I B Patel
(74) Attorney, Agent, or Firm—Schwegman, Lundberg, Woessner & Kluth, P.A.

(57) ABSTRACT

An apparatus including a substrate, and a surface mount component coupled with a top surface of the substrate, where the component includes side surfaces and a bottom surface, and the bottom surface is disposed adjacent to the top surface of the substrate. The side surfaces and the bottom surface of the surface mount component define a lower portion therebetween, the lower portion recessed away from the bottom component surface to allow solder to flow freely around a mounting lead of the surface mount component, for example, during the reflow process.

20 Claims, 5 Drawing Sheets

SURFACE MOUNT COMPONENT

TECHNICAL FIELD

The present invention relates generally to connectors, and in particular relates to surface mount connectors methods of attachment therefor.

BACKGROUND

Circuit boards are designed to have more power with increasing capabilities, and simultaneously being designed to achieve more using less space, at faster speeds, without substantially adding to the overall cost of the product. As a result, more chips, as well as other types of components, are being surface mounted to the printed circuit board, resulting in a higher component density within a smaller volume of space. However, conventional surface mount processing and methods are sometimes incapable of adequately providing a reliable high density surface mountable component, such as a connector. Furthermore, conventional surface mount processing is sometimes incapable of adequately providing a reliable surface mount component which can handle forces applied to printed circuit boards in standard processes, such as assembly, testing and/or shipping, and in the user field, post-production.

One example of the kinds of forces applied to the surface mount components is during assembly of the printed circuit board. In tough handling processes, such as shipping and/or testing, which place additional stresses on the circuit board and/or the surface mount components, the risk of mechanical and/or electrical failure of these surface mount components is increased. Furthermore, similar or other conditions in the user field could result in failure.

One example of a component which is surface mounted on to the printed circuit board is a surface mount RJ45 connector. In current RJ45 connectors, the plastic body 50 of the connector is substantially square-shaped at a juncture near the lead 52, the printed circuit board 54, and a lower edge 56 of the plastic body 50, as shown in FIG. 1. The square shape is disposed directly adjacent to the lead 52 and the printed circuit board 54. When solder is flowed around the leads 52 of the component, the solder flow is obstructed during the reflow process, and a high concentration of stress results in the encircled area 60 of the fillet 66. Furthermore, mounting pegs 64 are disposed through the printed circuit board 54, and a distal end 62 of the mounting pegs 64 protrudes out of the printed circuit board 54. As the printed circuit board is placed on planar surfaces, such as during testing, further stress is placed on the fillet 66, occasionally causing the fillet 66 to crack. The solder joints at the leads have a marginal tensile strength, and are prone to developing mechanical fractures at this same location, leading to mechanical and/or electrical failure.

Accordingly, what is needed is a surface mount component that can be better secured to the printed circuit board. What is further needed is a method of attaching a surface mount component that is better secured to the printed circuit board.

DETAILED DESCRIPTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the scope of the present inventions. The following detailed description is, therefore, not to be taken in a limiting sense, and the scope of the present invention is defined only by the appended claims.

Figure 2:
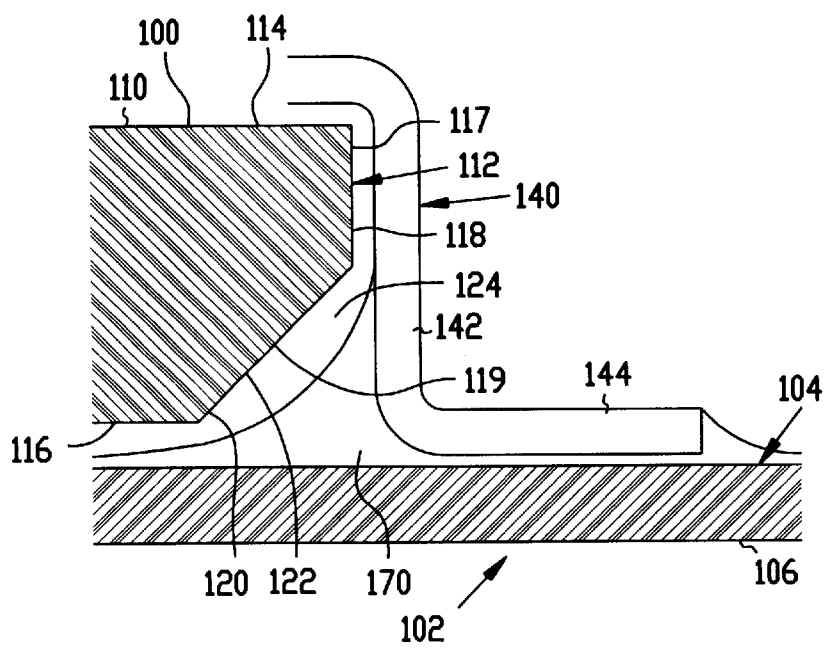
FIG. 2 is a cross-sectional view of a portion of a surface mount component as constructed in accordance with one embodiment.
Figure 3:
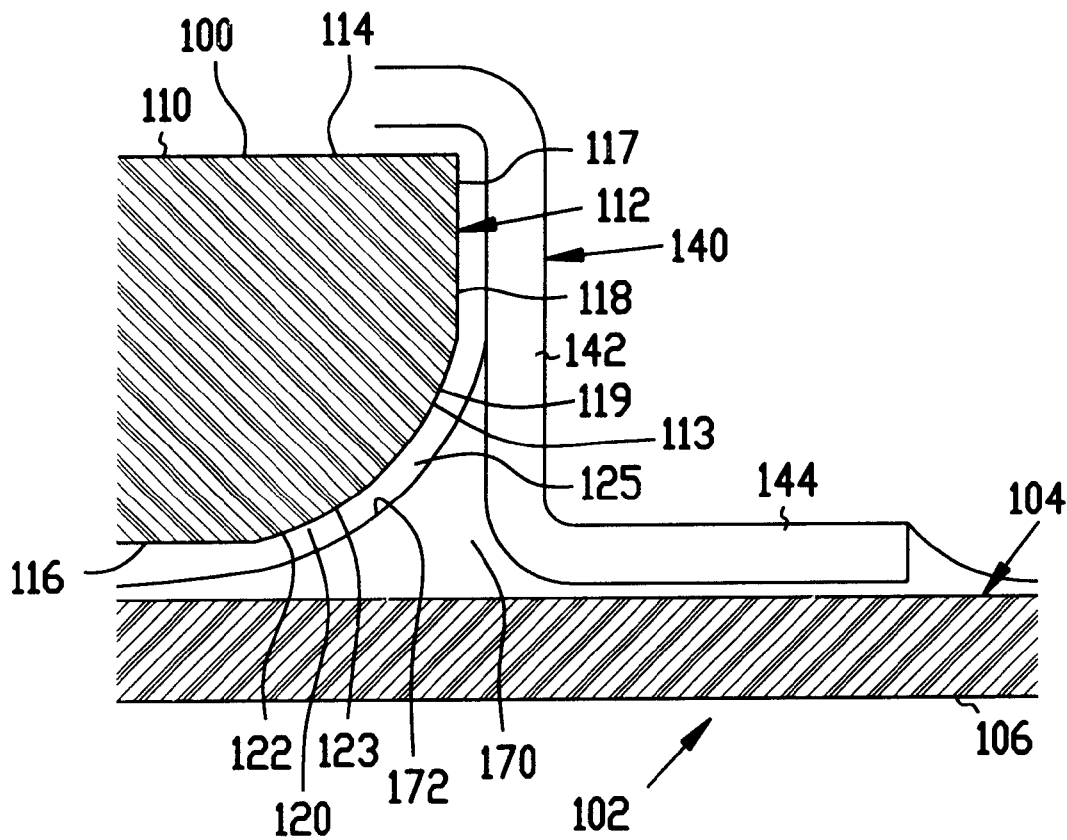
FIG. 3 is a cross-sectional view of a portion of a surface mount component as constructed in accordance with one embodiment.

A portion of a surface mount component 100 is illustrated in FIGS. 2–4 which allows for improved attachment to a substrate, and increased resistance to mechanical and/or electrical continuity failure. The surface mount component 100 is mounted to a substrate 102, for instance, a printed circuit board or a NIC (Network Interface Card) card. The substrate 102 includes a first top surface 104, a second lower surface 106, and has one or more mounting holes 108 (FIG. 4) therein, where the mounting holes 108 (FIG. 4) extend fully or partially from the first top surface 104 to the second lower surface 106. In one option, the one or more mounting holes 108 (FIG. 4) comprise a through-hole in the substrate 102. Examples of the surface mount component 100 include, but are not limited to, connectors such as FCI connectors or Molex Connectors. In one example, the surface mount component comprises a surface mount RJ-45 connector.

Referring to FIG. 2, a cross section of a connector 110 is shown. The connector 110 generally comprises a body having a substantially square or rectangular cross-section. The connector 110 includes a plastic body 112 and one or more retention leads 140 extending therefrom. The body of the connector 110 is referred to as a plastic body 112, however, other rigid or semi-rigid materials for the body 112 are suitable. The plastic body 112 includes a top component surface 114, a bottom component surface 116, and side surfaces 118. Side surfaces 118 include outer side surfaces 117, and also interior side surfaces which are adjacent to a lead 140.

At least one of the retention leads 140 extends down the side of the side surface 118 along a vertical segment 142. The retention leads 140 further includes a horizontal segment 144 which couples with a surface of the substrate 102. The retention lead 140 is disposed adjacent to a lower corner portion 119, as further discussed below.

Disposed between the side component surface 118 and the bottom component surface 116 is a lower corner portion 119, as shown in FIG. 2. It should be noted that the term "corner" does not require that portion 119 is square or rectangular. Instead, lower corner portion 119 refers to a general location of the component 100. The lower corner portion 119, in one embodiment, is recessed away from the bottom component surface 116 and/or the side component surfaces 118 to form a recessed portion 120. The recessed portion 120 allows for solder to naturally flow around the leads 140. In one option, the recessed portion 120 includes a surface 122 which is substantially planar and is at an oblique angle relative to the side component surfaces 118 and the bottom component surface 116, and forms an open area 124 between the at least one retention lead 140 and the surface 122, and the printed circuit board 102.

The surface 112, in one option, forms a beveled surface which defines the recessed portion 120. In another option, as shown in FIG. 3, the surface 122 is a rounded surface 123. The rounded surface 123 and the lead 140 and the top surface 104 define an open area 125 which allows for solder to flow freely between the retention lead 140 and the surface 123, and the substrate 102. In yet another option, the lower corner portion 119 forms a non-square surface to define a recessed portion 120.

To mechanically and electrically couple the component 100 with the substrate 102, the substrate 102 is reflowed, for example, with solder. It should be noted, however, that other coupling methods and materials are suitable. The soldering process allows for a fillet 170 of coupling material, i.e. solder, to couple the retention lead with the substrate 102, and to fill between the lower corner portion 119 and the first top surface 104 of the substrate 102. The recessed portion 120 allows for the coupling material to freely flow therein, and to form a much more substantial fillet, and forms a fillet with significantly greater tensile strength. In one option, the fillet 170 has a first profile 172 which substantially corresponds to a second profile 113 of the surface 122 forming the recessed portion 120.

Figure 4A:
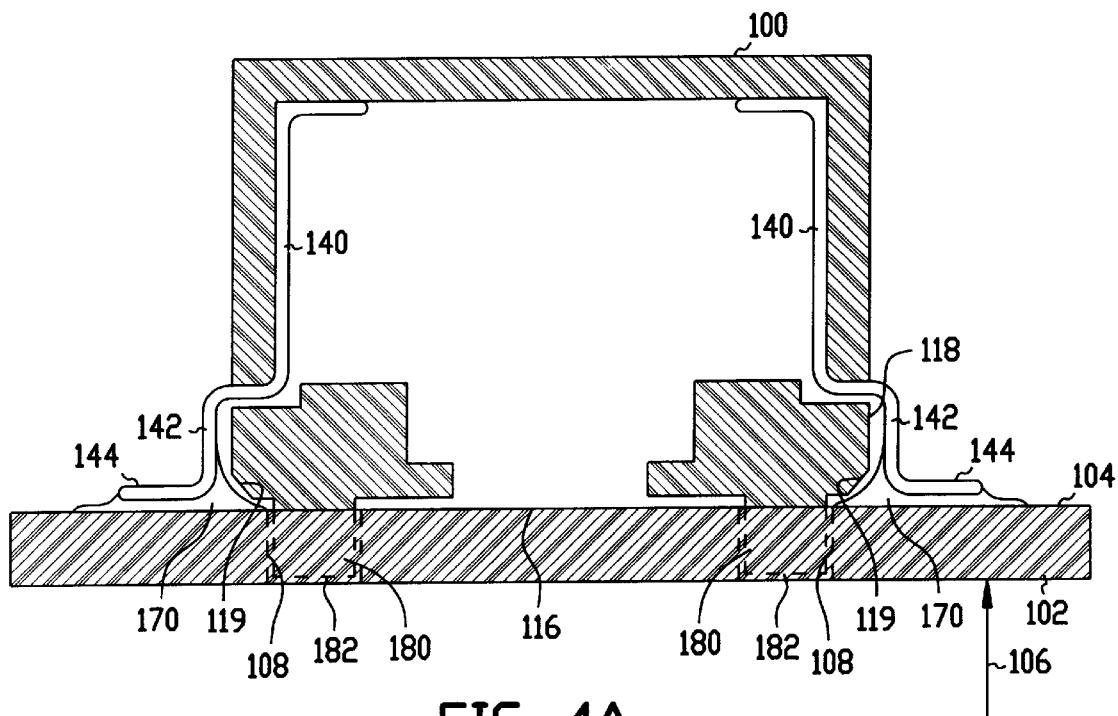
FIG. 4A is a side view of a surface mount component as constructed in accordance with one embodiment.
Figure 4B:
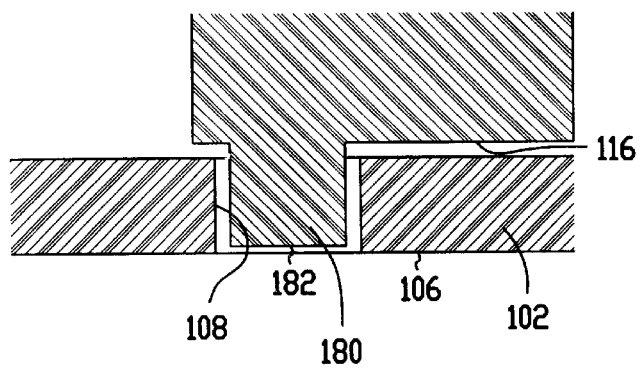
FIG. 4B is a cross-sectional view of a surface mount component as constructed in accordance with one embodiment.

As mentioned above, the component 100 is coupled with the substrate 102. The component 100 includes surface mount components, and further includes the various embodiments discussed above and below. The bottom surface 116 of the component 100 is disposed adjacent to the first top surface 104 of the substrate 102. In another embodiment, as shown in FIGS. 4A and 4B, the component 100 includes one or more pegs 180, for example on the bottom component surface 116. The one or more pegs 180 extend away from the component 100 to a distal end 182, and assist in guiding the component 100 and in mechanically coupling the component 100 with the substrate 102.

Figure 5A:
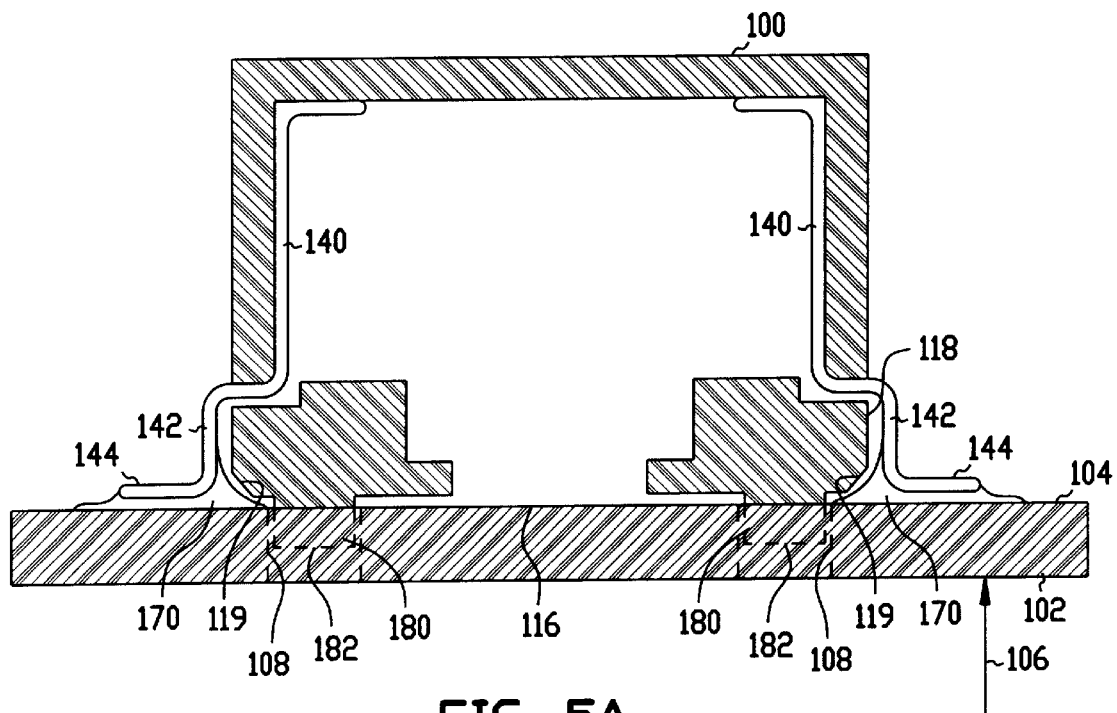
FIG. 5A is a side view of a surface mount component as constructed in accordance with one embodiment.
Figure 5B:
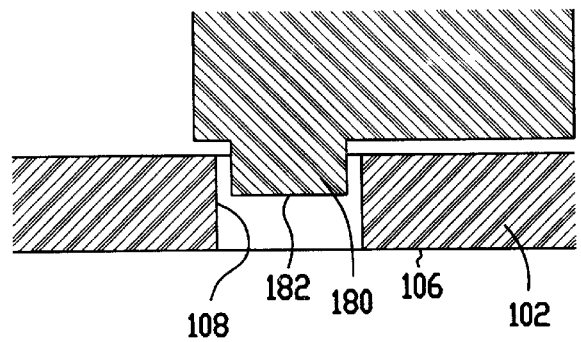
FIG. 5B is a cross-sectional view of a surface mount component as constructed in accordance with one embodiment.

To couple the component 100 with the substrate 102, the distal end 182 of the one or more pegs 180 are disposed within the mounting holes 108 of the substrate 102. The one or more pegs 180 are sized to be freely received within the mounting holes 108. In another option, the one or more pegs 180 are sized to be received within the mounting holes 108 with a friction fit. In one option, the distal end 182 of the one or more pegs 180 is disposed within the mounting holes 108 such that the distal end 182 is substantially even with the second lower surface 106 of the substrate 102, where the distal end 182 does not protrude out from the second lower surface 106 of the substrate 102. In another option, as shown in FIGS. 5A and 5B, the distal end 182 is disposed through the mounting holes 108 such that the distal end 182 is positioned between the first upper surface 104 and the second lower surface 106 of the substrate 102. By modifying the length of the one or more pegs 180, the one or more pegs 180 assist in preventing exertion of tensile stress on the solder joints of the retention leads 140 (FIG. 3), for example, when the substrate 102 is placed on a flat surface, i.e. a table during testing.

Figure 6:
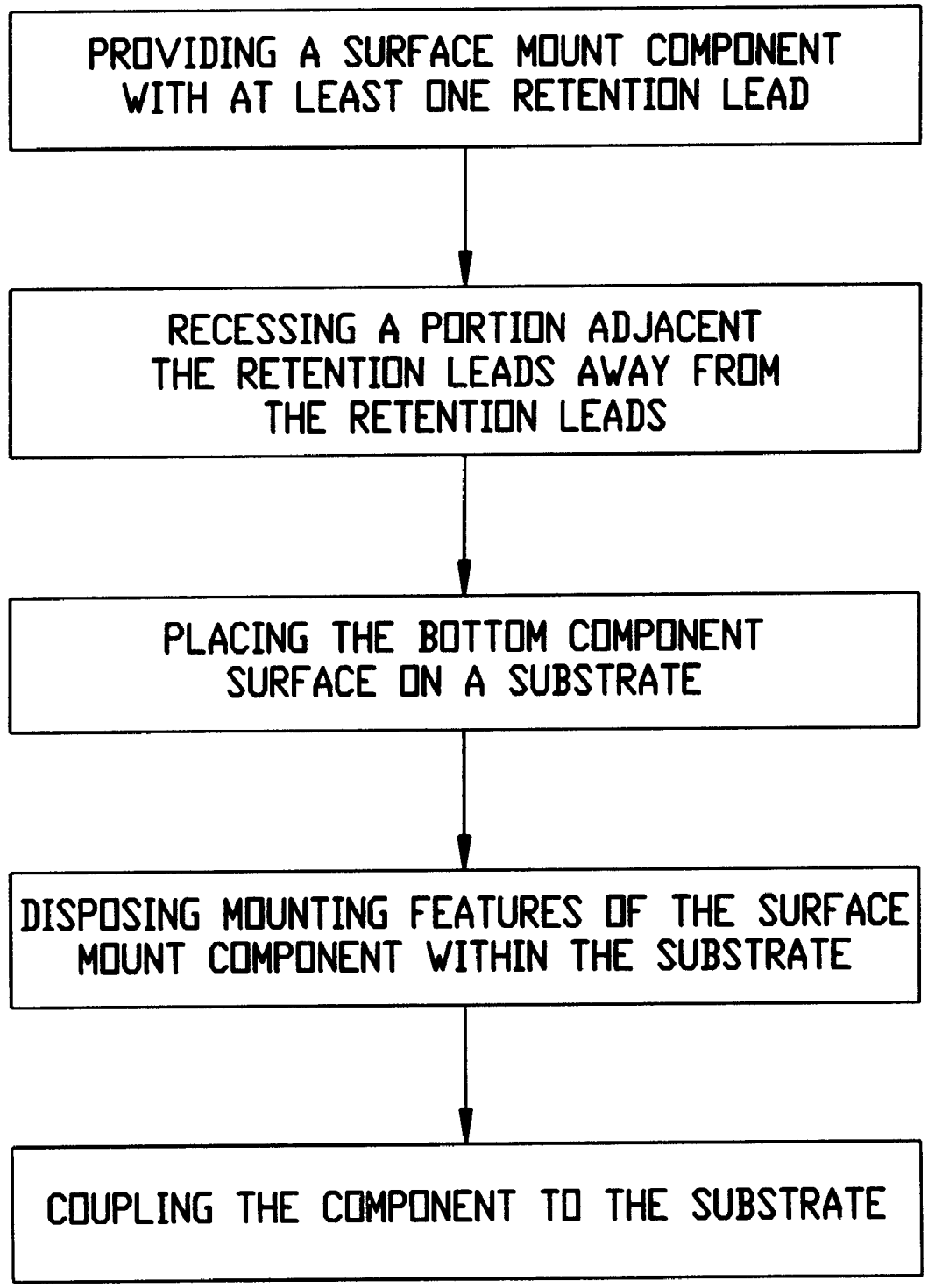
FIG. 6 is a block diagram of a method for attaching a surface mount component to a substrate as constructed in accordance with one embodiment.

A method for attaching the surface mount component to a substrate is shown in block diagram in FIG. 6. The surface mount component includes, but is not limited to, the various embodiments described above. In one embodiment, the method includes providing a component for placement on a substrate, the component defined in part by a top component surface, side surfaces and a bottom component surface, the side surfaces and the bottom component surface defining a lower portion therebetween. The method further includes recessing the lower portion away from the bottom surface of the component, placing the bottom component surface adjacent to a first top surface of the substrate, and coupling the component to a substrate, including forming a fillet between a first top surface of the substrate and the lower portion of the component. In another option, the method includes recessing a portion of the component body adjacent the retention leads away from the retention leads.

In one option, the component includes two or more leads extending from a portion of the component, for example, the side surfaces of the component. The leads include a vertical segment and a horizontal segment, where the horizontal segment is used to attach the component to the substrate. The method optionally includes forming the fillet higher than a horizontal segment of the lead, where the horizontal segment is in contact with the substrate.

In recessing at least a portion near the lead of the component away from the lead, optionally, a portion near the bottom surface of the component is recessed, which allows for the solder to form around the lead in a natural profile. This provides a stress-free configuration that is less susceptible to fracturing. This can be done in a number of manners. For instance, the recessed portion includes a non-square surface on the lower portion of the component. In another option, the recessed portion includes a beveled surface on the lower portion of the component. In yet another option, the recessed portion includes a rounded surface on the lower portion of the component. Since the sharp corner of the component body has been recessed, this allows for better distribution of the solder with respect to the component body. For instance, the component body has a body profile which corresponds to the recessed portion. After the fillet of coupling material, for example solder, has been formed, the fillet material has a fillet profile formed between the lead and the lower portion of the component, where the fillet profile substantially corresponds to the body profile. The stress is distributed over a broader region, which renders the fillet to be less prone to fracturing.

Several other options for the method are as follows. For instance, the surface mount component optionally includes additional mounting features, and the method includes disposing the mounting features through mounting holes of the substrate, and in a further option, disposing the mounting features through the mounting holes such that a distal end of the mounting features are substantially flush with the bottom surface of the substrate. In another option, the method includes placing the distal end of the mounting features between the bottom surface and the top surface of the component.

Figure 1:
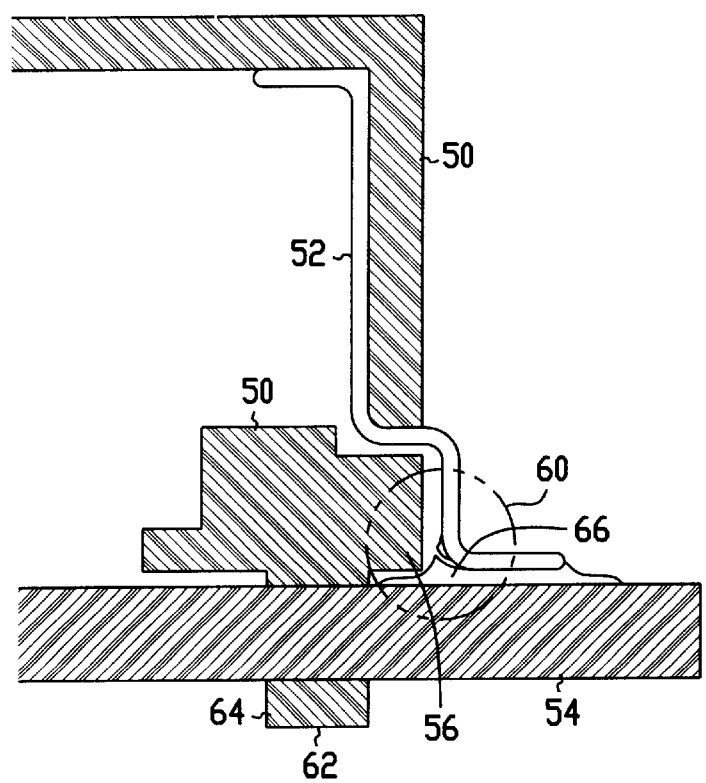
FIG. 1 is a cross-sectional view of a portion of a prior art surface mount component.

The above described embodiments assist in retention of components to substrates, and further reduce failure of the components as a result of force placed on the components during testing, shipping, and/or handling, and user applications, where the user exerts both in-plane shearing and out-of-plane tensile stresses on the connector. It has been determined that the above described embodiments substantially improve the tensile strength of RJ45 connectors including a modified component body. For instance, the connectors have a 100% improvement in tensile strength over devices such as that shown in FIG. 1, when the connectors include a modified component body, such as the connectors shown in FIG. 2 or FIG. 3.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. An apparatus comprising:
    a substrate having a substrate top surface and a substrate lower surface, the substrate including at least one mounting hole disposed through the substrate top surface and the substrate lower surface;
    a component coupled with the substrate top surface of the substrate, the component including a top surface, side surfaces and a bottom surface, the bottom surface disposed adjacent to the substrate top surface;
    wherein the component includes an upper portion and a lower corner portion, the lower corner portion is recessed away from at least one of the bottom surface or the side surfaces of the component to form a recessed surface; and
    one or more pegs extending from the component to a distal end, the one or more pegs disposed within the mounting hole, the distal end of the peg disposed within the substrate without extending past the substrate lower surface, the one or more pegs located within an outer periphery of the component, wherein the component is coupled with the substrate with a fillet of coupling material, and the fillet substantially fills a recessed area defined in part by the recessed surface of the component.

2. The apparatus as recited in claim 1, wherein the recessed surface includes a beveled surface defining a recessed area.

3. The apparatus as recited in claim 1, wherein the recessed surface includes a rounded surface defining a recessed area.

4. The apparatus as recited in claim 1, wherein the recessed surface includes a non-square surface defining a recessed area.

5. The apparatus as recited in claim 1, wherein the component comprises an RJ-45 connector.

6. The apparatus as recited in claim 1, wherein the component further comprises at least one retention lead having a vertical segment which extends near one of the side surfaces of the component.

7. The apparatus as recited in claim 1, wherein the component further comprises at least one retention lead having a vertical segment which extends substantially parallel to one of the side surfaces of the component.

8. The apparatus as recited in claim 1, wherein the component further comprises at least one retention lead including a vertical segment and a horizontal segment, wherein the vertical segment extends near one of the component side surfaces, one of the component side surfaces closer to the vertical segment than the recessed surface.

9. The apparatus as recited in claim 1, wherein the component further comprises at least one retention lead including a vertical segment and a horizontal segment, wherein the vertical segment is substantially parallel to one of the component side surfaces, the one of the component side surfaces closer to the vertical segment than the recessed surface, the vertical segment of the lead and the horizontal segment of the lead extending outside the component bottom surface and outside the component top surface.

10. An apparatus comprising:
    a substrate having a substrate top surface and a substrate lower surface;
    a surface mount component coupled with the substrate top surface of the substrate, the surface mount component defined in part by a top component surface, side surfaces and a bottom component surface;
    the bottom component surface disposed adjacent to the substrate top surface, the side surfaces and the bottom component surface defining a lower comet portion therebetween, the lower corner portion recessed away from the bottom component surface and/or the side surfaces;
    a fillet of coupling material having a portion disposed between the bottom component surface and the top substrate surface near the lower corner portion; and
    one or more pegs extending from the component to a distal end, the one or more pegs disposed within the mounting hole, the distal end of the peg disposed within the substrate without extending past the substrate lower surface, the one or more pegs located within an outer periphery of the component, wherein the component is coupled with the substrate with a fillet of coupling material, and the fillet substantially fills a recessed area defined in part by the recessed surface of the component.

11. The apparatus as recited in claim 10, wherein the lower corner portion has a non-square profile.

12. The apparatus as recited in claim 11, wherein a portion of the lower corner portion comprises a beveled edge.

13. The apparatus as recited in claim 11, wherein at least a portion of the lower corner portion comprises a rounded surface.

14. The apparatus as recited in claim 10, further comprising two or more leads which mechanically couple the surface mount component with the substrate, the leads extending between the side surfaces and the substrate top surface, the lower corner portion disposed directly adjacent to the two or more leads.

15. The apparatus as recited in claim 14, wherein the leads include at leant a first portion extending from the surface mount component, the leads include a second portion which couples with the top surface of the substrate, and the fillet extends substantially higher than the second portion of the leads.

16. The apparatus as recited in claim 10, wherein the substrate comprises a printed circuit board, and the component comprises an RJ-45 connector.

17. The apparatus as recited in claim 10, further comprising two or more leads which mechanically couple the surface mount component with the substrate, the two or more leads crossing at least one of the component side surfaces, the two or more leads including portions substantially parallel to one of the component side surfaces, the one of the component side surfaces closer to the two or more leads than the lower corner portion.

18. An apparatus comprising:

a surface mount component including a body;

one or more leads coupled with the body of the surface mount component;

the one or more leads and the body having a portion therebetween, where the portion is recessed away from the leads to form a recessed area allowing solder to reflow naturally and stress-free therein; and one or more pegs extending from the component to a distal end, the one or more pegs disposed within the mounting hole, the distal end of the peg disposed within the substrate without extending past the substrate lower surface, the one or more pegs located within an outer periphery of the component, wherein the component is coupled with the substrate wit a fillet of soldering material, and the fillet substantially fills a recessed area defined in part by the recessed surface of the component.

19. The apparatus as recited in claim 18, where the portion includes a beveled surface defining the recessed area.

20. The apparatus as recited in claim 18, wherein the portion includes a rounded surface defining the recessed area.

* * * * *

UNITED STATES PATENT AND TRADEMARK OFFICE
CERTIFICATE OF CORRECTION

PATENT NO. : 6,552,275 B2
DATED : April 22, 2003
INVENTOR(S) : Arjang Fartash and Raiyomand F. Aspandiar It is certified that error appears in the above-identified patent and that said Letters Patent is hereby corrected as shown below:

Column 6,
Line 21, delete "comet" and insert -- corner -- therefor.

Column 8,
Line 3, delete "wit" and insert -- with -- therefor.
Line 7, delete "where" and insert -- wherein -- therefor.

Signed and Sealed this

Twenty-third Day of September, 2003

JAMES E. ROGAN
*Director of the United States Patent and Trademark Office*